United States Patent
Marchack et al.

(10) Patent No.: US 10,770,652 B2
(45) Date of Patent: Sep. 8, 2020

(54) MAGNETIC TUNNEL JUNCTION (MTJ) BILAYER HARD MASK TO PREVENT REDEPOSITION

(71) Applicant: International Business Machines Corporation, Armonk, NY (US)

(72) Inventors: Nathan P. Marchack, New York, NY (US); Bruce B. Doris, Slingerlands, NY (US); Pouya Hashemi, Purchase, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/238,846

(22) Filed: Jan. 3, 2019

(65) Prior Publication Data

US 2020/0220072 A1    Jul. 9, 2020

(51) Int. Cl.
*H01L 43/12* (2006.01)
*H01L 43/02* (2006.01)
*H01L 27/22* (2006.01)

(52) U.S. Cl.
CPC ............ *H01L 43/12* (2013.01); *H01L 27/222* (2013.01); *H01L 43/02* (2013.01)

(58) Field of Classification Search
CPC ....... H01L 43/12; H01L 43/02; H01L 27/222; H01L 23/08
See application file for complete search history.

(56) References Cited

U.S. PATENT DOCUMENTS

| 6,985,384 | B2 * | 1/2006 | Costrini ................. H01L 43/12 257/295 |
| 7,001,783 | B2 | 2/2006 | Costrini et al. |
| 7,696,551 | B2 | 4/2010 | Xiao et al. |
| 8,450,119 | B2 | 5/2013 | Torng et al. |
| 8,574,928 | B2 | 11/2013 | Satoh et al. |
| 8,722,543 | B2 | 5/2014 | Belen et al. |
| 8,883,520 | B2 | 11/2014 | Satoh et al. |
| 9,070,869 | B2 * | 6/2015 | Jung ..................... H01L 27/222 |
| 9,269,893 | B2 | 2/2016 | Lu et al. |
| 9,343,659 | B1 | 5/2016 | Lu et al. |

(Continued)

FOREIGN PATENT DOCUMENTS

WO    WO-2004032144 A2 *  4/2004  ............ H01L 43/12

*Primary Examiner* — Earl N Taylor
(74) *Attorney, Agent, or Firm* — Scully, Scott, Murphy & Presser, P.C.; Daniel Morris, Esq.

(57) ABSTRACT

A semiconductor structure and fabrication method of forming a semiconductor structure. The method first provides an electrically conductive structure embedded in an interconnect dielectric material layer of a magnetoresistive random access memory device. A conductive landing pad is located on a surface of the electrically conductive structure. A multilayered magnetic tunnel junction (MTJ) structure and an MTJ cap layer is formed on the landing pad. Then there is formed a first conductive layer on top the MTJ cap layer and a second conductive metal layer formed on top the first conductive layer. A pillar mask structure is then patterned and formed on the second conductive layer. The resulting structure is subject to lithographic patterning and etching to form a patterned bilayer metal hardmask pillar structure on top the MTJ cap layer. Subsequent etch processing forms an MTJ stack having sidewalls aligned to the patterned bilayer metal hardmask pillar.

13 Claims, 4 Drawing Sheets

(56) References Cited

U.S. PATENT DOCUMENTS

| | | | |
|---|---|---|---|
| 9,450,180 B1 | 9/2016 | Annunziata et al. | |
| 9,608,200 B2 | 3/2017 | Shen et al. | |
| 9,705,071 B2 | 7/2017 | Annunziata et al. | |
| 9,847,473 B2 | 12/2017 | Hsu et al. | |
| 10,002,904 B2 | 6/2018 | Annunziata et al. | |
| 10,069,064 B1* | 9/2018 | Haq | H01L 43/12 |
| 10,461,251 B2* | 10/2019 | Aggarwal | H01L 27/228 |
| 2004/0063223 A1* | 4/2004 | Costrini | H01L 43/12 438/3 |
| 2004/0084400 A1 | 5/2004 | Costrini et al. | |
| 2005/0146927 A1* | 7/2005 | Costrini | H01L 43/12 365/174 |
| 2010/0327248 A1 | 12/2010 | Khoueir et al. | |
| 2015/0104882 A1* | 4/2015 | Jung | H01L 43/12 438/3 |
| 2015/0188033 A1 | 7/2015 | Lamborn et al. | |
| 2016/0351799 A1 | 12/2016 | Xue et al. | |
| 2017/0033282 A1 | 2/2017 | Wang et al. | |
| 2017/0092850 A1* | 3/2017 | Lee | H01L 43/12 |
| 2017/0186944 A1 | 6/2017 | Annunziata et al. | |
| 2019/0088864 A1* | 3/2019 | Cho | H01L 43/12 |
| 2019/0103554 A1* | 4/2019 | Aggarwal | H01L 27/222 |
| 2019/0173004 A1* | 6/2019 | Deshpande | H01L 43/12 |
| 2019/0288188 A1* | 9/2019 | Sonoda | H01L 43/08 |
| 2019/0363248 A1* | 11/2019 | Shen | H01L 43/08 |

\* cited by examiner

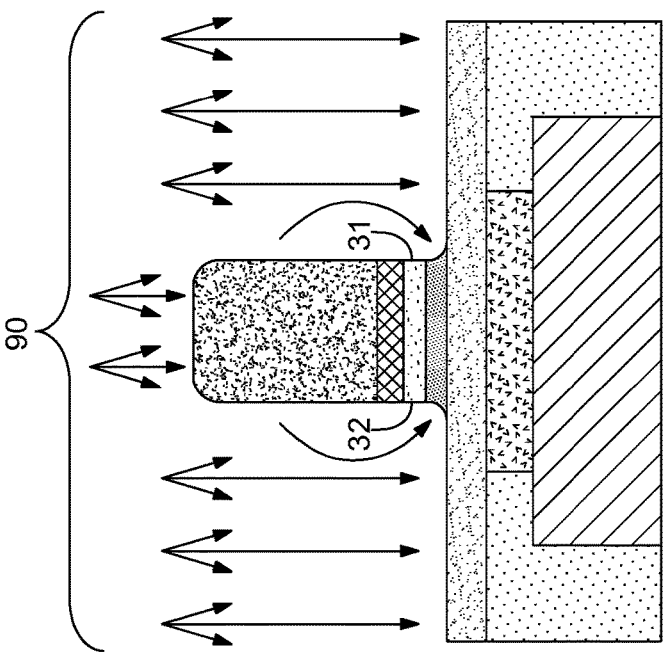
FIG. 1A PRIOR ART
FIG. 1B PRIOR ART
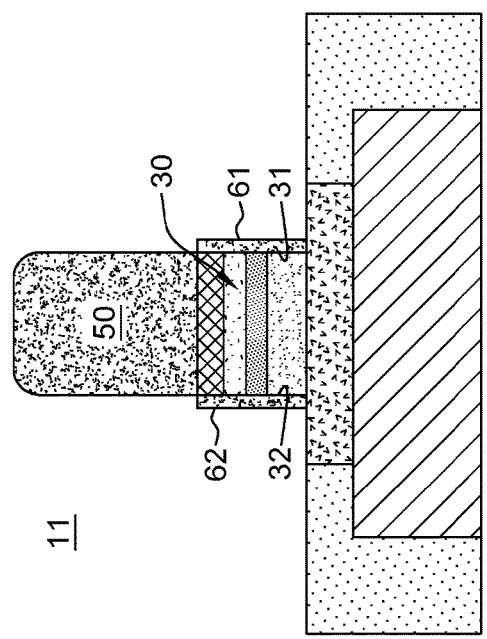
FIG. 1C PRIOR ART

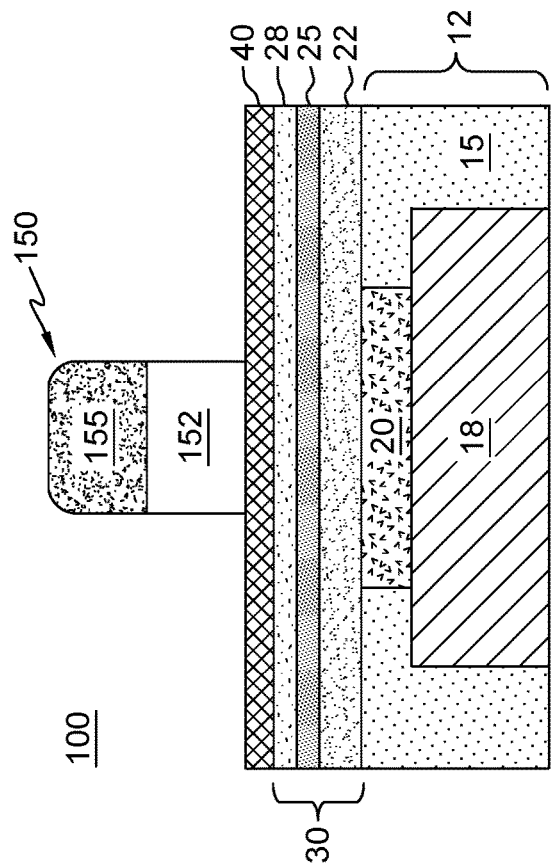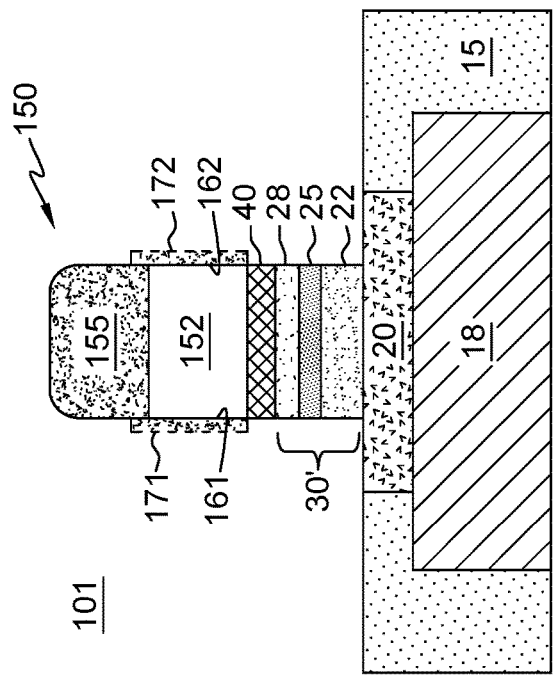
FIG. 2A
FIG. 2B

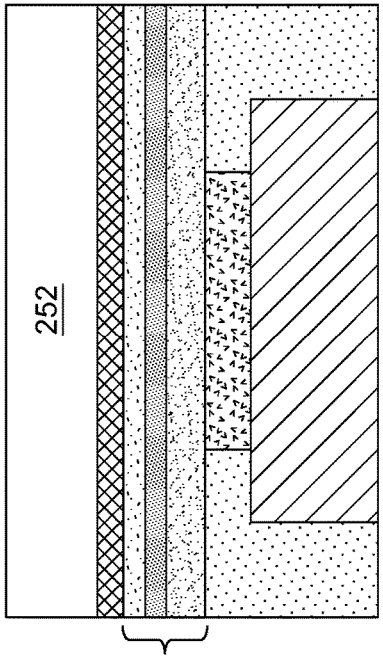
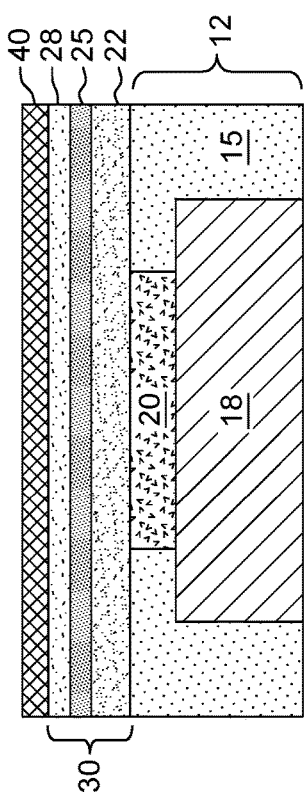
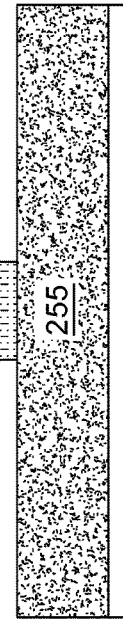
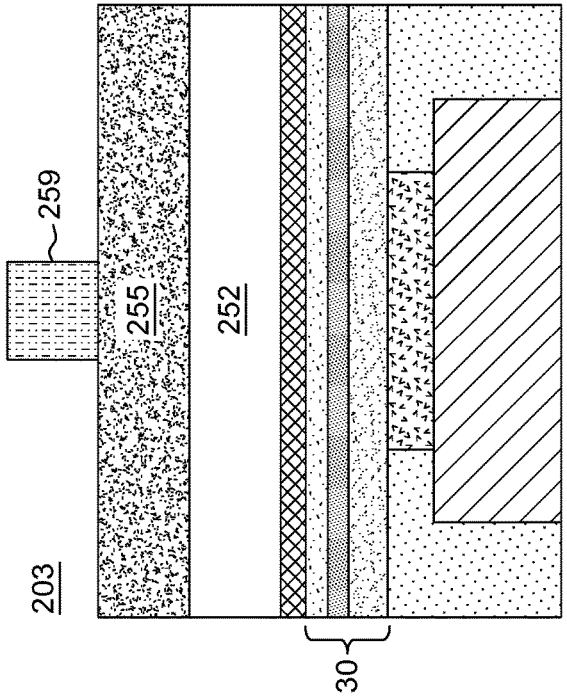
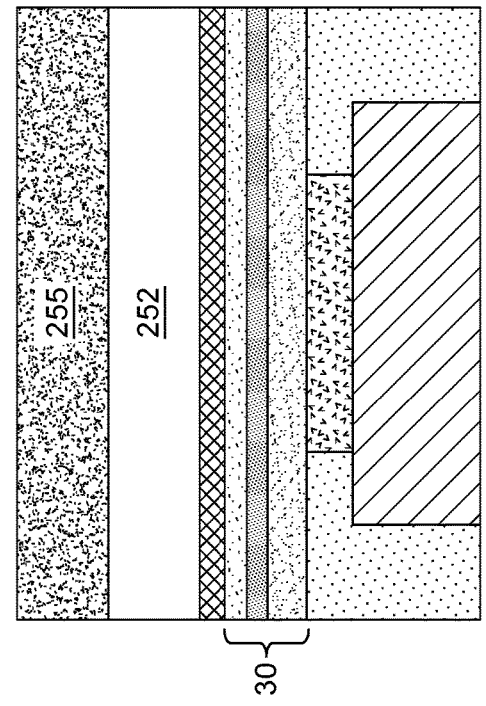
FIG. 3A
FIG. 3B
FIG. 3C
FIG. 3D

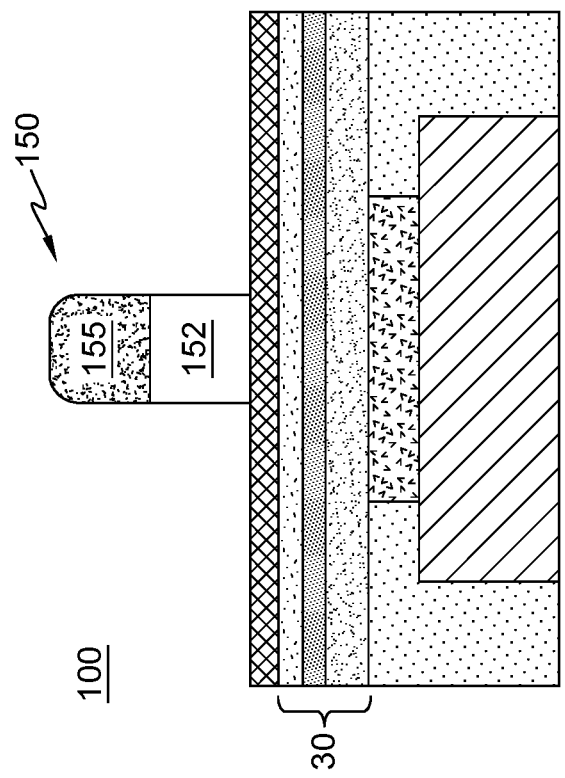
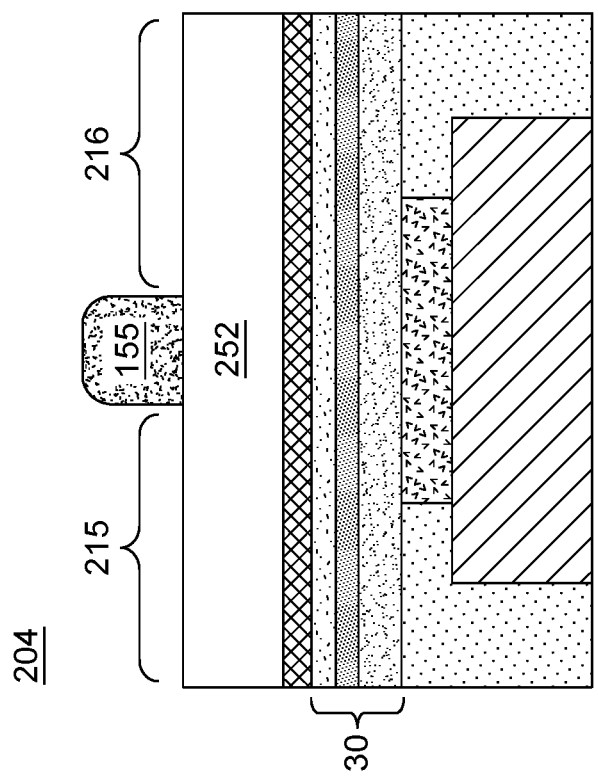

MAGNETIC TUNNEL JUNCTION (MTJ) BILAYER HARD MASK TO PREVENT REDEPOSITION

BACKGROUND

The present invention relates to a magnetic tunnel junction and its fabrication method, and more particularly, to a magnetic tunnel junction with a bilayer hard mask that prevents degradation of the performance of a magnetic tunnel junction (MTJ) structure.

MRAM is a non-volatile random access memory technology in which data is stored by magnetic storage elements. These elements are typically formed from two ferromagnetic layers, each of which can hold a magnetization, separated by a thin dielectric layer. One of the two layers is a permanent magnet set to a particular polarity; the other layer's magnetization can be changed to match that of an external field to store memory. Such a configuration is known as magnetic tunnel junction (MTJ).

In leading-edge or neuromorphic computing systems, a MTJ structure (or pillar) is typically embedded within a back-end-of-the-line (BEOL) structure, a metal hard mask is typically formed above a multilayered MTJ structure, and the metal hardmask is used as an etch mask to provide the MTJ structure.

Current semiconductor manufacturing techniques of an MTJ bit, i.e., a MTJ stack, requires patterning of the fixed layer, free layer, and tunnel layer. However, current processing techniques for patterning of MTJ stacks encounter issues with redeposition, as the stack is often etched using physical sputtering.

However, redeposition of conductive metal on a sidewall of the MTJ device, particularly across the tunnel barrier, can create a short circuit.

Moreover, as the metal hardmask often doubles as the top electrode in an MTJ cell, it is also a source of potential redeposition. This layer is exposed to the stack etch for the entire duration and thus can serve as a source of potential metal redeposition.

SUMMARY

A structure and method of controlling redeposition of conductive products from the hardmask by creating a bilayer hardmask structure, whereby a first conductive layer with a low-sticking coefficient is situated closer to the MTJ stack, and a second conductive layer with a higher sticking coefficient is located over the first conductive layer.

A fabrication method to produce such a bilayer hardmask structure prior to the MTJ stack etch is also provided to improve production and reliability of MTJ devices and MRAM arrays and prevent degradation of the performance of a magnetic tunnel junction (MTJ) structure.

In accordance with a first aspect of the invention, there is provided a semiconductor structure. The semiconductor structure comprises: a first electrically conductive structure embedded in an interconnect dielectric material layer and located in a magnetoresistive random access memory (MRAM) device area; a conductive landing pad located on a surface of the first electrically conductive structure in the MRAM device area; a multi-layered magnetic tunnel junction (MTJ) structure located on the conductive landing pad; a metal cap layer formed on a surface of the MTJ stack; and a bilayer metal hardmask structure formed on a surface of the cap layer, the bilayer metal hardmask structure having a first conductive metal layer formed above the metal cap layer and a second conductive metal layer formed atop the first conductive metal layer that is different from the first conductive metal layer.

In a second aspect of the invention, there is further provided: a method of forming a semiconductor structure. The method comprises: providing a first electrically conductive structure embedded in a first interconnect dielectric material layer and located in a magnetoresistive random access memory (MRAM) device area, wherein a conductive landing pad is located on a surface of the first electrically conductive structure; forming a multilayered magnetic tunnel junction (MTJ) structure and a MTJ cap layer on the conductive landing pad; and forming a patterned bilayer metal hardmask structure on a surface of the MTJ cap layer, the patterned bilayer metal hardmask structure having a first conductive metal layer formed above the metal cap layer and a second conductive metal layer formed atop the first conductive metal layer that is different from the first conductive metal layer.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

FIG. 1A is a sectional view of a magnetic tunnel junction (MTJ) structure of an MRAM bit in accordance with conventional implementations;

FIG. 1B depicts a physical etch process to form a MTJ stack having sidewall in alignment with outer sidewalls of a hardmask layer;

FIG. 1C is a sectional view of a magnetic tunnel junction (MTJ) structure of FIG. 1A according to the prior art that results from sputter etching to form the MTJ layer stack and showing a potential redistributing of metal along the etched MTJ stack sidewalls;

FIG. 2A is a sectional view of an intermediate magnetic tunnel junction (MTJ) structure of an MRAM bit including a bilayer hardmask formed according to an embodiment of the invention;

FIG. 2B is a sectional view of the magnetic tunnel junction (MTJ) structure of FIG. 2A after sputter etching of the MTJ layer stack showing a potential redistributing of the hard mask metal along the lower sidewalls of the bilayer hardmask; and FIGS. 3A-3F show a method according to a further embodiment for preventing a redeposition of potential hardmask residue during manufacture of the MRAM bit structure.

DETAILED DESCRIPTION OF THE PREFERRED EMBODIMENTS

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Magnetoresistive random access memory (MRAM) is a non-volatile memory that combines a magnetic device with standard silicon-based microelectronics to obtain the combined attributes of non-volatility, high-speed read/write operations, high read/write endurance and data retention. Data is stored in MRAM as magnetic states or characteristics (e.g., polarity or magnetic moment) instead of electric charges. In a typical configuration, each MRAM cell includes a magnetic tunnel junction (MTJ) structure (i.e., pillar) for data storage, a bit line and a word line. In general, the MTJ's electrical resistance will be high or low based on the relative magnetic states of certain layers within the MTJ structure. Data is written to the MTJ structure by applying certain magnetic fields or charge currents to switch the magnetic states of the layers of the MTJ structure. Data is read by detecting the resistance of the MTJ structure. Using a magnetic state/characteristic for storage has two main benefits. First, unlike electric charge, magnetic state does not leak away with time, so the stored data remains even when system power is turned off. Second, switching magnetic states has no known wear-out mechanism. The term "magnetoresistance" describes the effect whereby a change to certain magnetic states of the MTJ structure results in a change to the MTJ resistance, hence the name "Magnetoresistive" RAM.

Referring first to FIG. 1A, there is illustrated a first exemplary conventional MRAM bit structure during an early stage of fabrication including a multilayered MTJ structure 30 formed above a lower metal interconnect level 12, an MTJ cap layer 40 formed on the multilayered MTJ structure 30, and an etch stop hardmask layer 50 formed on the MTJ cap. Examples of material forming MTJ conductive cap include Ru, RuOx material deposited using lithographic patterning and deposition techniques.

In the sectional view of MRAM element 10 depicted in FIG. 1A is the lower interconnect level structure 12 including a first electrically conductive structure or bottom electrode 20 embedded in an interconnect dielectric substrate 15. A conductive pad metal can include TaN, Ta, TiN, T, W. A diffusion barrier liner may be present between the electrically conductive contact structure 20 and the interconnect dielectric material layer 15. Conductively contacting bottom surface of bottom electrode 20 in alignment with the pad 20 is a conductive (metal) interconnect structure 18 formed in the interconnect dielectric material layer 15.

In some embodiments, the lower interconnect level is positioned above a middle-of-the line (MOL) level that includes a MOL dielectric material layer (not shown) having a metal contact structure embedded therein. The MOL level may be located above a front-end-of-the-line (FEOL) level (not shown) in which a plurality of FEOL semiconductor devices such as, for example, transistors, capacitors and/or resistors are formed.

The lower interconnect dielectric material layer 15 may include an inorganic dielectric material or one containing a non-trivial amount of organic material. In one embodiment, the lower interconnect dielectric material layer 15 may be non-porous. In another embodiment, the lower interconnect dielectric material layer 15 may be porous. Some examples of suitable dielectric materials (i.e., interconnect dielectrics) that may be used as the interconnect dielectric material layer 15 include, but are not limited to, silicon dioxide, silsesquioxanes, C doped oxides (i.e., organosilicates) that includes atoms of Si, C, O and H, or multilayers thereof.

The lower interconnect dielectric material layer 15 typically has a dielectric constant that is about 3.0 or less, with a dielectric constant of about 1.8 or less being more typical. All dielectric constants mentioned herein are relative to a vacuum, unless otherwise noted. These dielectrics generally have a lower parasitic cross talk as compared with dielectric materials that have a higher dielectric constant than 4.0. The thickness of the first interconnect dielectric material layer 15 may vary depending upon the type of dielectric material(s) used. In one example, the first interconnect dielectric material layer 15 may have a thickness from 50 nm to 1000 nm. Other thicknesses that are lesser than, or greater than, the aforementioned thickness range may also be employed in the present application for the thickness of the lower interconnect dielectric material layer 15. The first interconnect dielectric material layer 15 may be formed utilizing any deposition process including, but not limited to, CVD, PECVD or spin-on coating.

The lower interconnect dielectric material layer 15 is then processed to include a plurality of openings (not shown). A single opening and/or a plurality of openings can be formed into the MRAM device area and any non-MRAM device area at the interconnect dielectric material layer 15. In the illustrated embodiment of FIG. 1A, a single opening is formed in the MRAM device area. The openings, which are used to house, the first electrically conductive structures 18 may extend entirely through the first interconnect dielectric material layer 15. The openings may be via openings, line openings or combined via/line openings. The openings may be formed by lithography and etching.

A diffusion barrier material layer may then be formed into the opening and on the topmost surface of the interconnect dielectric material layer 15. The diffusion barrier material layer includes a diffusion barrier material (i.e., a material that serves as a barrier to prevent a conductive material such as copper from diffusing through) such as, for example, Ta, TaN, Ti, TiN, Ru, RuN, RuTa, RuTaN, W, or WN. In some embodiments, the diffusion barrier material layer may include a material stack of diffusion barrier materials. In one example, the diffusion barrier material layer may be composed of a stack of Ta/TaN. The thickness of the diffusion barrier material layer may vary depending on the deposition process used as well as the material employed. In some embodiments, the diffusion barrier material layer may have a thickness from 2 nm to 50 nm; although other thicknesses for the diffusion barrier material layer are contemplated and can be employed in the present application. The diffusion barrier material layer can be formed by a deposition process including, for example, chemical vapor deposition (CVD), plasma-enhanced CVD (PECVD), atomic layer deposition (ALD), physical vapor deposition (PVD), sputtering, chemical solution deposition or plating.

An electrically conductive metal or metal alloy is formed into each opening and, is present, on the diffusion barrier material layer (not shown). Examples of electrically conductive metals that may be used in the present application include copper (Cu), aluminum (Al), or tungsten (W), while an example of an electrically conductive metal alloy is a Cu—Al alloy. The electrically conductive metal or metal alloy can be formed utilizing a deposition process such as, for example, CVD, PECVD, sputtering, chemical solution deposition or plating. In one embodiment, a bottom-up plating process is employed in forming the electrically conductive metal or metal alloy.

Following the deposition of the electrically conductive metal or metal alloy, a planarization process such as, for example, chemical mechanical polishing (CMP) and/or grinding, can be used to remove the electrically conductive metal or metal alloy (i.e., overburden material) and the diffusion barrier material layer that is present outside each of the openings and from the topmost surface of the interconnect dielectric material layer 15. The planarization stops on a topmost surface of the interconnect dielectric material layer 15.

A dielectric capping layer (not shown) of pre-determined thickness can be formed upon the lower interconnect level utilizing deposition techniques. In some embodiments, the dielectric capping layer is formed first and thereafter the conductive landing pad 20 is formed within an opening provided in the dielectric capping layer. In other embodiments, the conductive landing pad 20 can be formed prior to the dielectric capping layer and then the dielectric capping layer is formed. In such an embodiment, an etch back process may be employed. In yet other embodiments, no dielectric capping layer is formed.

In any of the embodiments, conductive landing pad 20 is formed upon a surface of first electrically conductive structure 18 in the MRAM device area. The surface of the electrically conductive structure 18 in which the landing pad 20 is formed upon may be a non-recessed surface or a recessed surface. The conductive landing pad 20 may be composed of Ta, TaN, Ti, TiN, Ru, RuN, RuTa, RuTaN, Co, CoWP, CoN, W, WN or any combination thereof. The conductive landing pad 20 may have a thickness from 2 nm to 25 nm; other thicknesses are possible and can be used in the present application as the thickness of the conductive landing pad 20. The conductive landing pad 22 may be formed by a deposition process such as, for example, sputtering, ALD, CVD or PVD. An etch back process, a planarization process (such as, for example, chemical mechanical polishing), or a patterning process (such as, for example, lithography and etching) may follow the deposition of the conductive material that provides the conductive landing pad 20. In some embodiments and as illustrated in FIG. 1A, the conductive landing pad 20 has a topmost surface that is coplanar with an interconnect dielectric material layer 15. Alternatively, the conductive landing pad 20 has a topmost surface that is above, or below, the topmost surface of a dielectric capping layer (not shown).

As stated above, a multilayered MTJ structure 30 is located above the lower interconnect level. The multilayered MTJ structure 30 can be formed by utilizing one or more deposition processes such as, for example, CVD, PECVD, PVD, or sputtering. The multilayered MTJ structure 30 may include a stack, from bottom to top, of a reference layer 22, a tunnel barrier 25, and a free layer 28. The reference layer 22 has a fixed magnetization. The "pinned" reference layer 22 of the multilayered MTJ structure 30 may be composed of a metal or metal alloy that includes one or more metals exhibiting high spin polarization. In alternative embodiments, exemplary metals for the formation of the reference layer include iron, nickel, cobalt, chromium, boron, or manganese. Exemplary metal alloys may include the metals exemplified by the above. In another embodiment, the reference layer may be a multilayer arrangement having (1) a high spin polarization region formed from of a metal and/or metal alloy using the metals mentioned above, and (2) a region constructed of a material or materials that exhibit strong perpendicular magnetic anisotropy (strong PMA). Exemplary materials with strong PMA that may be used include a metal such as cobalt, nickel, platinum, palladium, iridium, or ruthenium, and may be arranged as alternating layers. The strong PMA region may also include alloys that exhibit strong PMA, with exemplary alloys including cobalt-iron-terbium, cobalt-iron-gadolinium, cobalt-chromium-platinum, cobalt-platinum, cobalt-palladium, iron-platinum, and/or iron-palladium. The alloys may be arranged as alternating layers. In one embodiment, combinations of these materials and regions may also be employed.

The tunnel barrier 25 of the multilayered MTJ structure 30 is composed of an insulator material and is formed at such a thickness as to provide an appropriate tunneling resistance. Exemplary materials for the tunnel barrier include magnesium oxide (MgO), aluminum oxide ($Al_2O_3$), and titanium oxide, or materials of higher electrical tunnel conductance, such as semiconductors or low-bandgap insulators.

The free layer 28 of the multilayered MTJ structure 30 is composed of a magnetic material with a magnetization that can be changed in orientation relative to the magnetization orientation of the reference layer. Exemplary materials for the free layer of the MTJ structure include alloys and/or multilayers of cobalt, iron, alloys of cobalt-iron, nickel, alloys of nickel-iron, and alloys of cobalt-iron-boron.

After providing the multilayered MTJ structure 30, the MTJ cap layer 40 is formed on the multilayered MTJ structure 30. The MTJ cap layer 40 may be composed of Nb, NbN, W, WN, Ta, TaN, Ti, TiN, Ru, Mo, Cr, V, Pd, Pt, Rh, Sc, Al or other high melting point metals or conductive metal nitrides, however the cap layer is meant to serve as an etch stop for the hard mask patterning process and should thus be resistant to the chemistry used to pattern the metal hardmask layer formed directly over it. The MTJ cap layer 40 may be formed utilizing a deposition process including, for example, CVD, PECVD, ALD, PVD, sputtering, chemical solution deposition or plating. The MTJ cap layer 40 may have a thickness from 2 nm to 25 nm; other thicknesses are possible and can be used in the present application as the thickness of the MTJ cap layer 40.

After providing the MTJ cap layer 40, a metal hardmask is conventionally formed over the MTJ cap 40. The MTJ cap hardmask can be formed utilizing a deposition process including, for example, CVD, PECVD, ALD, PVD, sputtering, chemical solution deposition or plating. Exemplary materials for the hardmask layer typically include "high-sticking" coefficient conductive material such as W, WN, Ta, TaN, Ru, Mo, Cr, V, Pd, Pt, Rh, Sc, Al or other high melting point metals or conductive metal nitrides. The upper hardmask layer may have a thickness from 50 nm to 100 nm; other thicknesses are possible and can be used in the present application as the thickness of the upper hardmask layer.

Using conventional lithographic patterning and plasma etching or RIE, the metal hardmask 50 is formed which can doubly function as a top electrode for the MRAM bit.

In accordance with conventional manufacturing techniques, as shown in FIG. 1B, to form the MRAM bit, the MTJ stack is mechanically etched, e.g., via mechanical sputtering, to remove portions of the stack MTJ stack layer 30 not covered by the hardmask 50. In FIG. 1B, the path of sputter deposition 90 is shown by arrows.

In such conventional implementations, this post etching of the stack 30, using sputtering or ion beam etching results in the outermost sidewalls of the MTJ stack and MTJ cap being vertically aligned with outermost sidewalls of the etch stop mask layer 50. An additional result of the sputtering is the causing of residue from the hardmask to form deposits on the sidewalls 31, 32 of the MTJ stack. FIG. 1C shows a result of post-etching of the stack 30 using conventional hard mask (metal) sputtering techniques depicting a residue metal material 61, 62 from the hardmask 50 being displaced (by sputtering) and depositing on the respective sidewalls 31, 32 of the MTJ stack. Any residue can electrically short the MTJ stack 30.

In accordance with a first embodiment of the present application, FIGS. 2A and 2B show a bilayer hardmask structure 100 and method for preventing a redeposition of potential hardmask residue during manufacture (e.g., ion-beam or sputter etching) of the MTJ stack structure. In one embodiment, the bilayer hardmask pillar structure 150 of the MTJ (magnetoresistive) device structure is formed directly over the MTJ cap layer 40 having a first conductive hardmask layer 152 with a low-sticking coefficient situated closer to the MTJ stack 30 and a second conductive hardmask layer 155 with a higher sticking coefficient (i.e., a material having a higher propensity for physical sputtering) located over the first conductive layer 152. In one embodiment, both of these layers 152, 155 can be metals or metal nitrides. In another embodiment, one of the conductive layers could be a form of conducting carbon, e.g. glassy carbon. Depending on the choice of materials, the first conductive layer 152 can be used to selectively pattern the second conductive layer 155. This reduces the total photoresist budget and can lead to improvements in line edge roughness (LER) and pitch scaling due to the reduced aspect ratio of the resist mask.

As shown in FIG. 2A, the first conductive layer 152 is a low-sticking coefficient metal material such as Ti, TiN, Nb, NbN or any metals having a sticking coefficient of less than 0.2. The thickness of the first conductive layer 152 may range anywhere from between 40 nm and 75 nm. The use of a low-sticking coefficient metal material 205 reduces the probability of redeposition. The second conductive hardmask layer 155 is a metal or metal nitride having a higher sticking coefficient. Example metals for conductive hardmask layer 155 may include W, WN, Ta, TaN, Ru, Mo, Cr, V, Pd, Pt, Rh, Sc, Al. The thickness of the second conductive layer 155 may range anywhere from between 30 nm and 25 nm. In the intermediate multiplayer-MTJ structure 100 of FIG. 2A, the height of the bilayer hardmask pillar 150 may range anywhere from between about 70 nm to about 100 nm while the diameter of the bilayer hardmask pillar structure 150 may range anywhere from between 35 nm-50 nm.

After forming the bilayer hardmask pillar structure 150 on the MTJ cap 40, a conducting of the subsequent dry or mechanical sputter etching 90 such as shown in FIG. 1B can displace the sputtered high-sticking coefficient metal material of bilayer hardmask 150 such that it can be re-deposited on lower sidewalls of the pillar structure 150 and thus would not form on a sidewall of the resulting MTJ stack structure 30' nor contribute to a short circuiting across the tunnel barrier.

FIG. 2B shows a resulting structure 101 after etching the MTJ stack layers 30 of FIG. 2A using sputtering or a similar physical etch process. The multi-layered MTJ stack 30 is all but removed except under the bilayer hardmask feature 150. Any redeposited material(s) resulting during the sputter etch is formed on the sidewalls 161 and 162 of the bilayer hardmask feature 150, and particularly at sidewalls of first conductive low-stick coefficient metal layer 152. Any resultant redeposited high-sticking coefficient metal layers 171, 172 are formed at respective bilayer hardmask sidewalls 161, 162 and do not impact MTJ device performance.

Continuing with the above-described method steps, FIGS. 3A-3F show a method according to a further embodiment for preventing a redeposition of potential hardmask residue during manufacture of the MRAM bit structure. FIG. 3A shows an intermediate structure 200 after the forming of the multilayered-MTJ stack 30 and the MTJ cap layer 40 using lithographic patterning and chemical deposition techniques in the manner as described above. FIG. 3B shows an intermediate structure 201 after forming a first conductive layer 252 of a low-sticking coefficient metal material on top of the MTJ cap layer 40. First conductive layer 252 may be formed using conventional CVD, PECVD, PVD deposition techniques of a metal such as Ti, TiN, Nb, NbN or any metal having a sticking coefficient of less than 0.2.

FIG. 3C shows an intermediate structure 202 after forming the second first conductive layer 255 of a high-sticking coefficient metal material on top of the first conductive layer 252. Second conductive layer 255 may be formed using conventional CVD, PECVD, PVD deposition techniques of a metal such as W, WN, Ta, TaN, Ru, Mo, Cr, V, Pd, Pt, Rh, Sc, Al or any metal having a sticking coefficient of greater than 0.2. In this case the etch resistance of the conductive layer will likely scale with sticking coefficient.

FIG. 3D shows an intermediate structure 203 after lithographic patterning and deposition results in the forming of a pillar mask layer on top the second first conductive layer 255 of a high-sticking coefficient metal material. In an embodiment shown in FIG. 3D, lithographic mask layer (e.g., organic planarization layer (OPL)) can be deposited over the blanket metal hardmask film 255. A pillar shape is obtained using patterning of the lithographic mask to form a pillar mask 259 (e.g., a negative image of a hole mask) which is used to define the MTJ stack.

This may be followed by one or more etch processes to form the resulting MRAM bit structure 100 having the bilayer hardmask structure 150 shown in FIG. 2A. FIG. 3E shows an intermediate structure 204 after conducting a plasma etch of the high-sticking coefficient metal conductive layer 255 using a suitable chemistry (e.g. using Cl-containing plasma for those materials which form volatile chlorides, $O_2$-based plasma for materials which form volatile oxides, etc.). As shown in FIG. 3E, conducting the chemical etch results in transferring the pillar/cylinder through the high-sticking coefficient metal hardmask layer to form a second conductive layer 155 of the bilayer structure 150. The chemical etch results in the removal of all of the high-sticking coefficient metal conductive layer 255 except for a portion of the second conductive metal layer underlying the pillar mask structure 259. In an embodiment, the same or successive halogen-based plasma etching, e.g., with $Cl_2$ chemistry, or some variation ($BCl_3$, HBr) may be conducted to remove the remaining exposed low-sticking coefficient metal layer portions 215, 216 to result in the final bilayer structure 150.

In particular, the etching of the low-sticking coefficient metal conductive layer 252 using a halogen-based plasma etch selective to the MTJ metal cap layer 40, results in the removal of the low-sticking coefficient metal conductive layer 252 except for under the formed second conductive layer 155 of the bilayer structure 150. Advantageously, this results in a reduced photoresist budget, and can help with pitch scaling of arrays. MTJ cap layer 40 of a material such as Ru serves as a good stop layer for Cl/F chemistries and protects the MTJ layer 30 from damage due to diffusion of those reactants.

FIG. 3F shows the resulting final intermediate MRAM element structure 100 having conductive bilayer hardmask pillar structure 150 formed atop MTJ cap layer 40 and MTJ stack layer 30 after the halogen-based etching of low-sticking conductive layer 252 of FIG. 3E. This resulting MTJ stack structure 100 having bilayer hardmask pillar structure 150 is then used for preventing redeposition of metal material on the MTJ stack sidewalls as a result of the MTJ stack 30 sputter etch as described with respect to FIG. 2B. In an embodiment, combinations of the bilayer hardmask elements 155 (top)/152 (bottom) can include, but is not limited to: $Ru(O_2)/Ti(N)$, $Ta(N)/Ti(N)$, $Ru(O_2)/Nb(N)$, or $W/Ti(N)$, where $Ru(O_2)$ is conductive.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
a first electrically conductive structure embedded in an interconnect dielectric material layer and located in a magnetoresistive random access memory (MRAM) device area;
a conductive landing pad located on a surface of the first electrically conductive structure in the MRAM device area;
a multi-layered magnetic tunnel junction (MTJ) stack structure located on the conductive landing pad;
a metal cap layer formed on a surface of said MTJ stack structure;
a bilayer metal hardmask structure formed on a surface of said metal cap layer, the bilayer metal hardmask structure having a first conductive metal layer of a low-sticking coefficient metal material formed above the metal cap layer and a second conductive metal layer of a high-sticking coefficient metal material formed atop the first conductive metal layer that is different from said first conductive metal layer.

2. The semiconductor structure as claimed in claim 1, wherein the bilayer metal hardmask structure is a pillar structure.

3. The semiconductor structure as claimed in claim 2, wherein outermost sidewalls of both the MTJ cap layer and the multi-layered MTJ stack structure are vertically aligned to outermost sidewalls of said bilayer metal hardmask pillar structure.

4. The semiconductor structure as claimed in claim 3, further comprising: a metal material layer on sidewall surfaces of said first metal conductive layer, said metal material layer comprising portions of said high-sticking coefficient metal material of said second conductive metal layer redeposited on sidewall surfaces of said first metal conductive layer.

5. The semiconductor structure of claim 1, wherein the low-sticking coefficient metal material is selected from the group comprising: Ti, TiN, Nb, NbN.

6. The semiconductor structure of claim 1, wherein the high-sticking coefficient metal material is selected from the group comprising: W, WN, Ta, TaN, Ru, Mo, Cr, V, Pd, Pt, Rh, Sc, or Al.

7. A method of forming a semiconductor structure, the method comprising:
providing a first electrically conductive structure embedded in a first interconnect dielectric material layer and located in a magnetoresistive random access memory (MRAM) device area, wherein a conductive landing pad is located on a surface of the first electrically conductive structure;
forming a multilayered magnetic tunnel junction (MTJ) layer and a MTJ cap layer on the conductive landing pad;
forming a patterned bilayer metal hardmask pillar structure on a surface of said MTJ cap layer, said patterned bilayer metal hardmask pillar structure having a first conductive metal layer of a low-sticking coefficient metal material formed above the MTJ cap layer and a second conductive metal layer of a high-sticking coefficient metal material formed atop the first conductive metal layer that is different from said first conductive metal layer, and
forming a multi-layered MTJ stack and MTJ cap by a physical etch process of said MTJ layer and MTJ cap layer using the patterned bilayer metal hardmask pillar structure as an etch mask.

8. The method as claimed in claim 7, wherein said forming a patterned bilayer metal hardmask pillar structure comprises:
depositing the first conductive metal layer on a surface of said MTJ cap layer;
depositing the second conductive metal layer on a surface of said first conductive metal layer; and
forming on a surface of said second conductive metal layer a pillar mask structure used to define the multi-layered MTJ stack.

9. The method as claimed in claim 8, further comprising:
etching said second conductive metal layer to remove all of said second conductive metal layer except for a portion of the second conductive metal layer underlying the pillar mask structure; and
removing the pillar mask structure.

10. The method as claimed in claim 9, further comprising:
etching said first conductive metal layer to remove all of said first conductive metal layer except for a portion of the first conductive metal layer underlying the second conductive metal layer portion to result in said patterned bilayer metal hardmask pillar structure.

11. The method as claimed in claim 7,
wherein the multi-layered MTJ stack results from the physical etch process of said multi-layered MTJ layer and said MTJ cap layer, wherein outermost sidewalls of both the MTJ cap and the MTJ stack are vertically aligned to outermost sidewalls of said patterned bilayer metal hardmask pillar structure.

12. The method as claimed in claim 11, further comprising:
redepositing of said high-sticking coefficient metal material of said second conductive metal layer on said outermost sidewall surfaces of said first conductive metal layer as a result of said physical etch process.

13. The method as claimed in claim 12, wherein said physical etch process comprises one of: a sputter deposition or ion beam etching.

\* \* \* \* \*